US012740343B2

(12) United States Patent
Chang et al.

(10) Patent No.: US 12,740,343 B2
(45) Date of Patent: Sep. 15, 2026

(54) STRUCTURE AND FABRICATION OF PCM-BASED CAPACITOR BANK

(71) Applicant: Taiwan Semiconductor Manufacturing Company, Ltd., Hsinchu (TW)

(72) Inventors: Kuo-Pin Chang, Zhubei City (TW); Yu-Wei Ting, Taipei City (TW); Hung-Ju Li, Hsinchu City (TW); Kuo-Ching Huang, Hsinchu City (TW)

(73) Assignee: TAIWAN SEMICONDUCTOR MANUFACTURING COMANY, LTD., Hsinchu (TW)

( * ) Notice: Subject to any disclaimer, the term of this patent is extended or adjusted under 35 U.S.C. 154(b) by 468 days.

(21) Appl. No.: 18/323,968

(22) Filed: May 25, 2023

(65) Prior Publication Data

US 2024/0397840 A1 Nov. 28, 2024

(51) Int. Cl.

| | |
|---|---|
| ***H10N 79/00*** | (2026.01) |
| ***H03H 11/04*** | (2006.01) |
| ***H10B 63/00*** | (2023.01) |
| ***H10D 1/68*** | (2025.01) |
| ***H10N 70/00*** | (2023.01) |
| ***H10N 70/20*** | (2023.01) |

(52) U.S. Cl.

CPC ............. *H10N 79/00* (2023.02); *H10B 63/30* (2023.02); *H10B 63/80* (2023.02); *H10D 1/692* (2025.01); *H10N 70/061* (2023.02); *H10N 70/063* (2023.02); *H10N 70/231* (2023.02); *H10N 70/826* (2023.02); *H10N 70/8413* (2023.02); *H10N 70/8613* (2023.02); *H10N 70/8828* (2023.02); *H03H 11/04* (2013.01)

(58) Field of Classification Search

CPC .. H10N 79/00; H10N 70/826; H10N 70/8413; H10N 70/8613

See application file for complete search history.

(56) References Cited

U.S. PATENT DOCUMENTS

2009/0309088 A1* 12/2009 Sakamoto ............ H10N 70/253
257/E45.002

FOREIGN PATENT DOCUMENTS

DE 102016100003 * 4/2017

* cited by examiner

*Primary Examiner* — Matthew L Reames

(74) *Attorney, Agent, or Firm* — Ingrassia Fisher & Lorenz, LLP | IF&L

(57) ABSTRACT

Structures and fabrication methods are disclosed wherein a switch and a capacitor are fabricated sharing the same process flow without the use of an extra mask. A first capacitor electrode is formed in parallel in the same metal layer using the same mask as a component of the PCM switch (e.g., a PCM switch heater electrode). A second capacitor electrode is formed in parallel in the same metal layer using the same mask as another component of the PCM switch (e.g., a PCM switch input pad or a PCM switch heat spreader). The capacitor insulator is formed in parallel in the same layer using the same mask as a PCM switch insulator (e.g., TBR or insulator between heat spreader and PCM layer).

20 Claims, 9 Drawing Sheets

STRUCTURE AND FABRICATION OF PCM-BASED CAPACITOR BANK

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
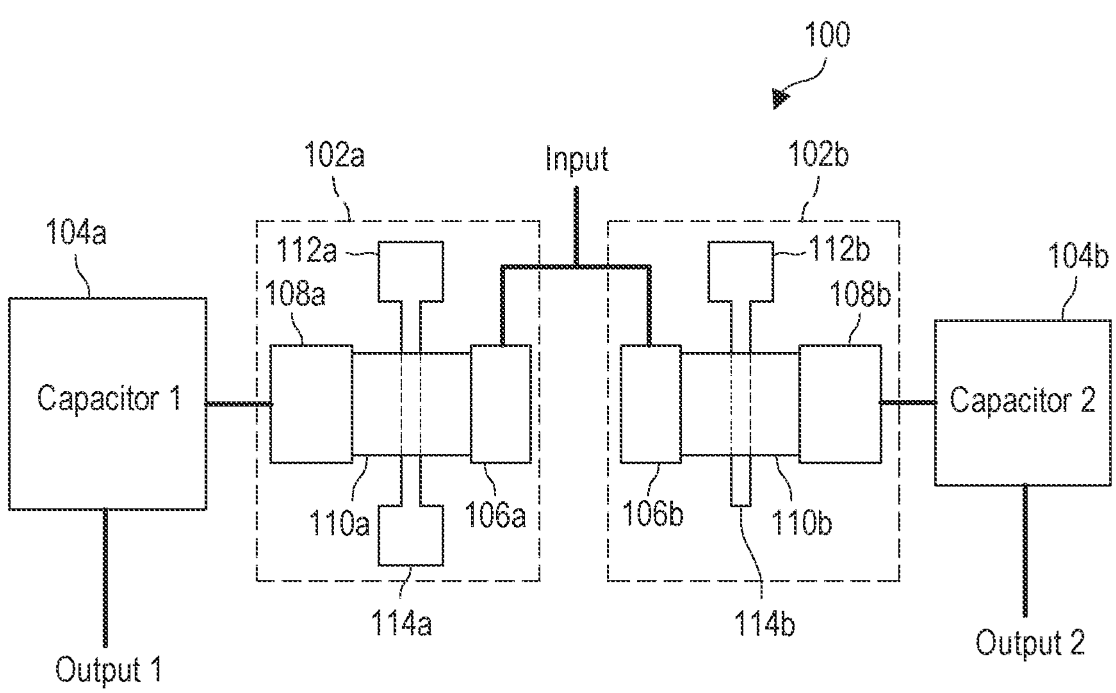
FIG. 1A is a block diagram depicting an example semiconductor device comprising a plurality of example PCM RF switches and a plurality of capacitors that may be fabricated concurrently at the same level, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting.

For the sake of brevity, conventional techniques related to conventional semiconductor device fabrication may not be described in detail herein. Moreover, the various tasks and processes described herein may be incorporated into a more comprehensive procedure or process having additional functionality not described in detail herein. In particular, various processes in the fabrication of semiconductor devices are well-known and so, in the interest of brevity, many conventional processes will only be mentioned briefly herein or will be omitted entirely without providing the well-known process details. As will be readily apparent to those skilled in the art upon a complete reading of the disclosure, the structures disclosed herein may be employed with a variety of technologies and may be incorporated into a variety of semiconductor devices and products. Further, it is noted that semiconductor device structures include a varying number of components and that single components shown in the illustrations may be representative of multiple components.

Furthermore, spatially relative terms, such as “over”, “overlying”, “above”, “upper”, “top”, “under”, “underlying”, “below”, “lower”, “bottom”, and the like, may be used herein for ease of description to describe one element’s or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When a spatially relative term, such as those listed above, is used to describe a first element with respect to a second element, the first element may be directly on the other element, or intervening elements or layers may be present. When an element or layer is referred to as being “on” another element or layer, it is directly on and in contact with the other element or layer.

It is noted that references in the specification to “one embodiment,” “an embodiment,” “an example embodiment,” “exemplary,” “example,” etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to affect such feature, structure, or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact.

Tunable filters are used for a variety of radio frequency (RF) applications. In various embodiments, a tunable filter includes a "switch", "inductor" and "capacitor". Multiple switches may be used to connect a selectable number of capacitors to generate different frequency spectrums for a tunable filter and then combine those connected capacitors to other circuit elements for use in an application such as a band pass filter.

In many systems, a switch is fabricated in one chip and passive devices (e.g., inductor and/or capacitor) that combine with the switch, for example to form a tunable filter, such as a bandpass filter, are packaged in a different package. Because the switch and the passive devices are fabricated and packaged separately, fabrication costs can be higher than if the switch and passive devices were fabricated and packaged together. Also, parasitic resistance and capacitance associated with off chip coupling of a switch and a passive device can cause performance loss. The parasitic resistance and capacitance can degrade a tunable filter's quality factor, distort resonant frequency, and distort power consumption.

The present disclosure provides for concurrent fabrication of a switch and capacitor in the same package. Because the switch and the capacitor are fabricated in parallel and packaged together, fabrication cost can be reduced compared to switch and capacitor combinations that are packaged separately, and parasitic resistance and capacitance associated with off chip coupling of the switch and the capacitor can be eliminated.

The present disclosure provides structures and fabrication methods wherein a switch and a capacitor bank are fabricated sharing the same process flow without the use of an extra mask. Thus, fabrication costs and die size can be reduced. The present disclosure provides a phase change material (PCM) RF switch (RFS) device for use as a switch. The present disclosure provides a MIM capacitor that uses a High-K dielectric as the insulating layer in the MIM capacitor.

The present disclosure provides structures and fabrication methods wherein the PCM RFS and capacitor bank are fabricated at the same layer resulting in low loss in signal transmission because the transmission path is short enough to maintain a resonant frequency without distortion. Moreover, capacitance requirements are reduced while the resonant frequency spectrum is good.

The present disclosure provides structures and fabrication methods wherein a wide-range band pass filter can be attained. Because the PCM RFS that has low insertion loss and the capacitors are fabricated in the same layer as the PCM RFS to shorten the transmission path, a frequency design using structures and fabrication methods provided in the present disclosure can be more flexible and has the capability to achieve a wide-range band pass filter.

Figure 1B:
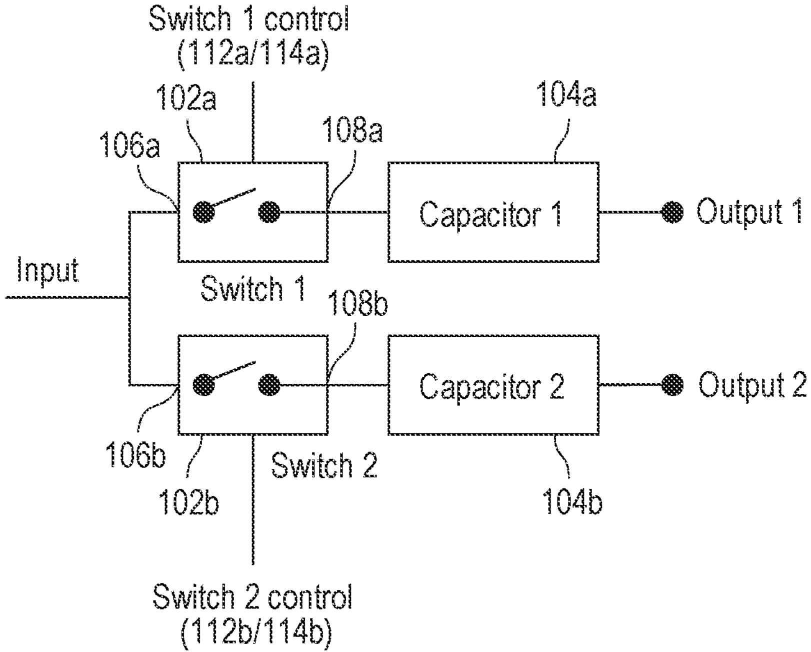
FIG. 1B is a simplified schematic diagram of example PCM RF switches and capacitors that may be fabricated concurrently at the same level, in accordance with some embodiments.

FIG. 1A is a block diagram depicting an example semiconductor device 100 comprising a plurality of example PCM RF switches (102*a*, 102*b*) and a plurality of capacitors (104*a*, 104*b*) that may be fabricated concurrently at the same level. FIG. 1B is a simplified schematic diagram of the example PCM RF switches (102*a*, 102*b*) and capacitors (104*a*, 104*b*) that may be fabricated concurrently at the same level. Each switch (102*a*, 102*b*) includes an input terminal (106*a*, 106*b*), an output terminal (108*a*, 108*b*), and a phase change material (PCM) switching element (110*a*, 110*b*). Each switch (102*a*, 102*b*) further includes a control line comprising a control input terminal (112*a*, 112*b*) and a control ground terminal (114*a*, 114*b*).

A control signal on the control input terminal (112*a*, 112*b*) causes the switching element (110*a*, 110*b*) of the switch (102*a*, 102*b*) to switch to an open or closed state thereby coupling (in the case of an open state) or blocking (in the case of a closed state) an input signal at the input terminal (106*a*, 106*b*) to or from the capacitor (104*a*, 104*b*) coupled to the output terminal (108*a*, 108*b*). This can allow the signal input to be applied across varying numbers of capacitors configured as capacitor 1 and capacitor 2 disclosed in FIGS. 1A and 1B based on a switch state to achieve varying frequency responses.

Figure 2:
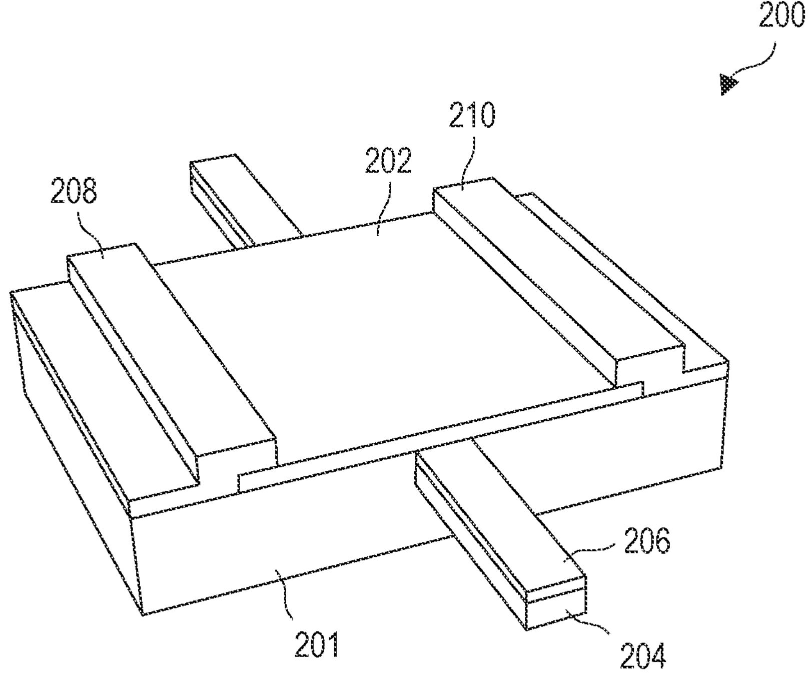
FIG. 2 is a block diagram depicting an example a phase change material RF switch (PCM RFS), in accordance with some embodiments.

FIG. 2 is a block diagram depicting an example PCM RFS 200. The example PCM RFS 200 is a wideband, low loss, high isolation solid-state electrical switching device disposed on isolation material 201 (such as an oxide) over a substrate (not shown). The example PCM RFS 200 includes phase-change material (PCM) 202 positioned between a gap in a metal conductor and over the isolation material 201. The example PCM RFS 200 further includes, disposed in the isolation material 201, a resistive heating element 204 disposed under an electrical isolation element 206 proximal to the PCM 202. The resistive heating element can be heated to change the conductivity state of the PCM 202. The example PCM RFS additionally includes two switch terminals 208, 210, which contact the PCM 202 on two opposing sides.

Figure 3A:
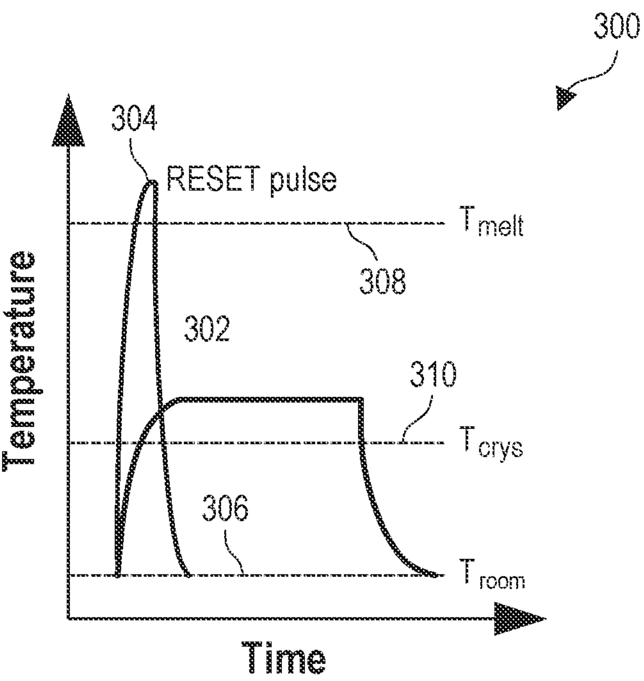
FIG. 3A is a chart illustrating an example relationship between temperature and time for a SET pulse and a RESET pulse for a PCM RFS, in accordance with some embodiments.
Figure 3B:
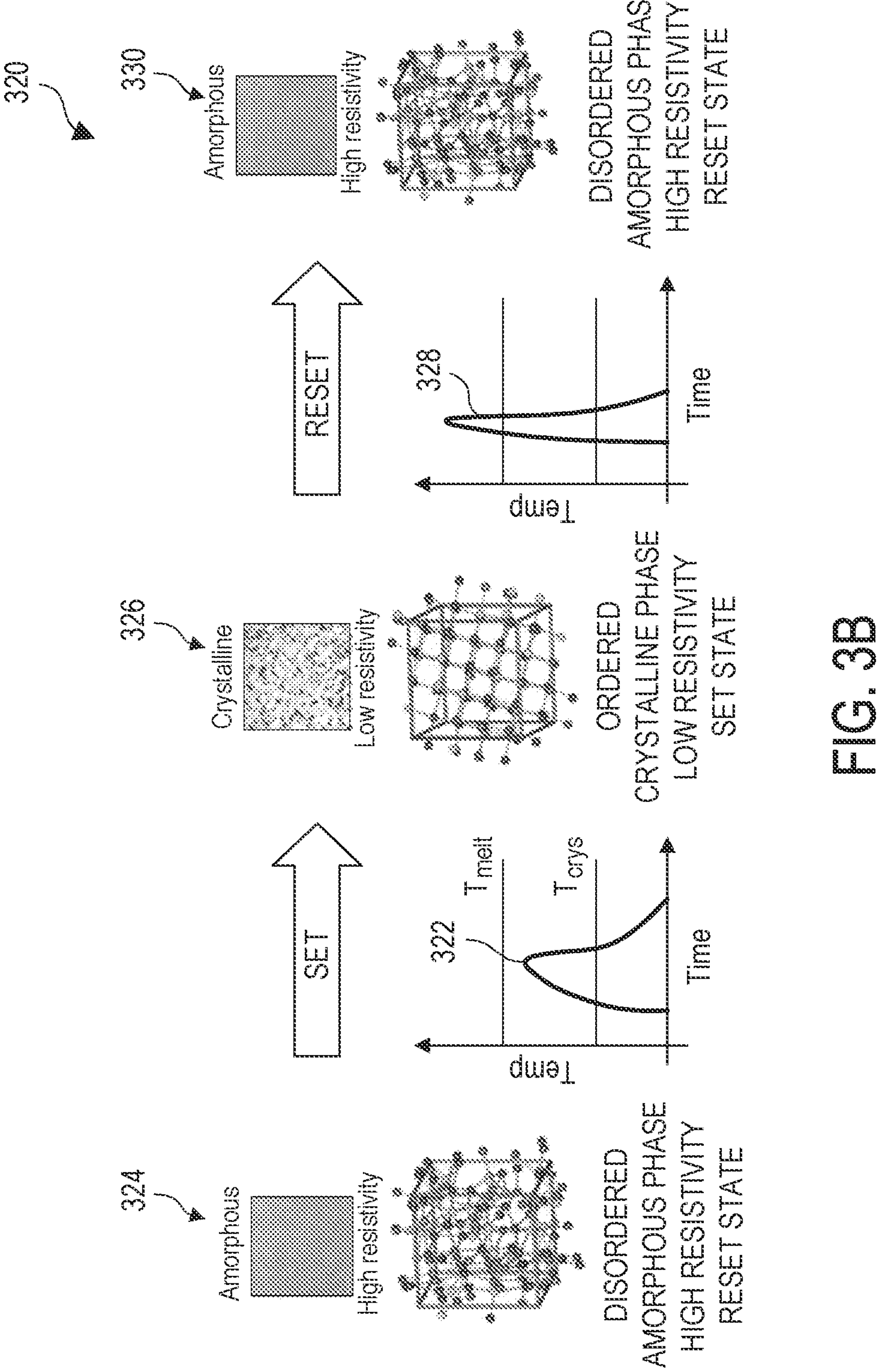
FIG. 3B is a diagram illustrating that a SET pulse can cause PCM to change from an amorphous state to a crystalline state, and that a RESET pulse can cause PCM to change from a crystalline state to an amorphous state, in accordance with some embodiments.

The conductivity of the PCM 202 can be changed by temperature cycling the PCM 202 in a particular way, for example via ohmic (i.e., $I^2R$) heat. FIG. 3A is a chart 300 illustrating an example relationship between temperature and time for a SET pulse 302 and a RESET pulse 304. As illustrated, a RESET pulse 304 rises from room temperature $T_{room}$ 306 to above a melting point temperature $T_{melt}$ 308 and cools back down to $T_{room}$ 306 over a relatively short period. A SET pulse 302 rises from room temperature $T_{room}$ 306 to a temperature above a crystallization temperature $T_{crys}$ 310 and below $T_{melt}$ 308 and cools back down to $T_{room}$ 306 over a longer period of time. FIG. 3B is a diagram 320 illustrating that a SET pulse 322 can cause PCM to change from an amorphous state 324 to a crystalline state 326, and that a RESET pulse 328 can cause PCM to change from a crystalline state 326 to an amorphous state 330.

Referring back to FIG. 2, in an example implementation, heating the PCM 202 to a melting temperature (e.g., approximately 725° C. for the case when the PCM 202 is germanium telluride (GeTe)) and cooling rapidly, results in an amorphous or insulating or blocking state (i.e., "off") state, while heating the PCM 202 to a crystallization temperature (e.g., approximately 180° C. for GeTe), holding at that temperature for a length of time sufficient to induce recrystallization, and cooling at any rate results in the crystalline or conductive (i.e., "on") state. By applying a voltage across the resistive heating element 204 via two control terminals (not shown), which make contact with the heating element 204 at each end, the heating element 204 is caused to heat up to supply the required heating profile to the PCM 202 for phase transformation.

Applying a high power pulse to the heating element 204 for some time (e.g., 1 ns-100 ms) causes the PCM component to take on the amorphous phase, thereby achieving the "off" state. Applying a second power pulse to the heating element 204 induces the recrystallization process which culminates in the crystallization of the PCM, thereby achieving the low resistivity "on" state. In the transformation from crystalline to amorphous, rapid cooling is achieved by keeping the heating pulse short in duration, which allows sufficient time for enough heat to transfer from the heating element 204 to the PCM 202 to raise its temperature above the melting temperature, but minimizes the amount of heat transferred to the surrounding materials. The PCM 202 retains both states (crystalline and amorphous) in the absence of any current or voltage to the heating element 204, making it non-volatile.

Figure 4A:
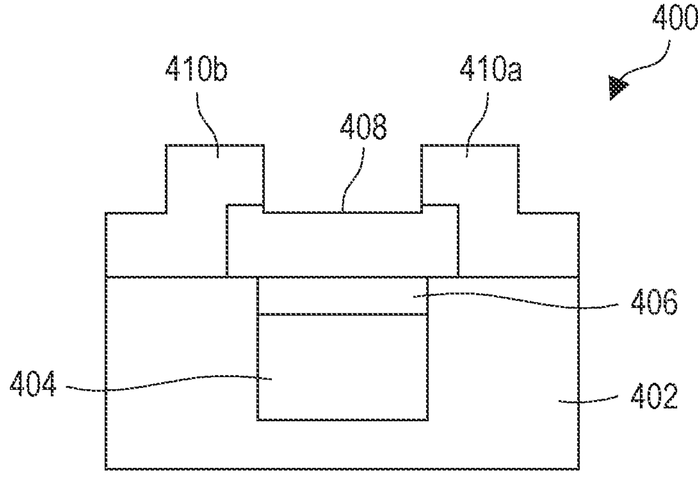
FIG. 4A is a schematic cross-sectional view of an example PCM switch structure, in accordance with some embodiments.
Figure 4B:
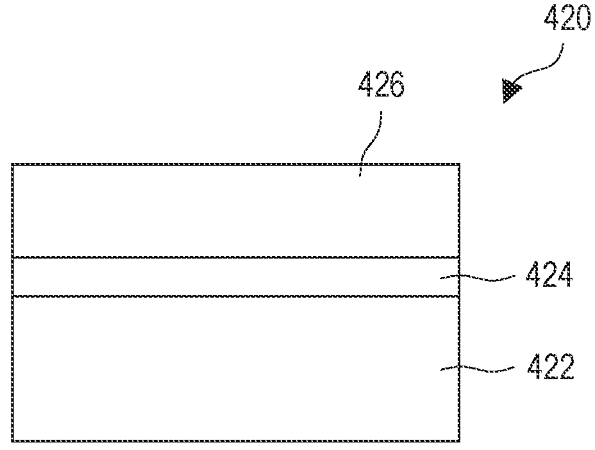
FIG. 4B is a schematic cross-sectional view of an example capacitor fabricated in the same process flow as a PCM switch structure, in accordance with some embodiment.

FIG. 4A is a schematic cross-sectional view of an example PCM switch structure 400, and FIG. 4B is a schematic cross-sectional view of an example capacitor 420 fabricated in the same process flow as the PCM switch structure 400. The PCM switch structure 400 includes an insulating layer 402 overlying a substrate (not shown). The substrate can be formed of a variety of mechanically supportive, insulating, semiconducting and/or conducting materials, such as, but not limited to, Silicon Carbide (SiC), Silicon (Si), Gallium Arsenide (GaAs), Sapphire (Al2O3), Alumina, Aluminum Nitride (AlN), Quartz ($SiO_2$), Germanium (Ge), Gallium Nitride (GaN), Indium Phosphide (InP), Silicon-on-Insulator (SOI), Silicon-on-Sapphire (SOS), and Silicon Germanium (SiGe). The insulating layer 402 can be formed of Silicon Dioxide ($SiO_2$), Aluminum Nitride (AlN), Aluminum Oxide (Al2O3), Silicon Nitride (SiN) or a variety of other electrically insulating materials.

The PCM switch structure 400 further includes a heating element 404 formed from a first metal layer that overlies the first insulating layer 402. The first metal layer can include a metal or metal alloy material that exhibits low resistivity and a high melting point. For example, the first metal layer can be formed from Tungsten (W), Tungsten nitride (WN), Titanium nitride (TIN), Nickel silicide (NiSi), or any of a variety of or a combination of similar metal or metal alloys that have the above properties and have a melting temperature that is higher than the melting temperature of a PCM layer 408 used in the PCM switch structure 400.

A thermal boundary (TBR) layer 406 made from a second insulating layer overlies the heating element 404. The second insulating layer is an electrical insulator that is thermally conductive such that the TBR layer 406 electrically insulates the heating element 404 from the PCM layer 408, but allows heat from the heating element 404 to pass through the TBR layer 406 to the PCM layer 408 to change the state of the PCM layer 408 between a crystallized state and an amorphous state. The TBR layer 406 has high thermal conductivity and good electrical isolation and can be formed of SiN, AlN, $SiO_2$, Silicon Carbide (SiC), diamond (C) or other barrier material having properties of electrically insulating the heating element 404 and allowing heat from the heating element 404 to pass through the TBR layer 406.

The PCM layer 408 overlies the second insulating layer 406 and is positioned above the heating element 404 to allow heat from the heating element 404 to pass through the TBR layer 406 to the PCM layer 408. The PCM layer 408 can be formed from a variety of PCMs that exhibit variable electrical resistivity that is dependent on crystallinity. As an example, the PCM layer 408 can be formed from a chalcogenide material, such as germanium telluride (GeTe), germanium antimony telluride (GeSbTe), germanium selenium telluride (GeSeTe), or any of a variety of similar materials.

Two metal terminals 410*a*, 410*b* formed from a second metal layer are disposed over a portion of the first isolating layer 402 and the PCM layer 408. A first metal terminal 410*a* extends from a first end of the PCM layer 408 to form an input, and a second metal terminal 410*b* extends from a second end of the PCM layer 408 to form an output terminal for the PCM layer 408. The second metal layer is formed from materials with low electrical resistivity such as W, WN, NiSi, and Al.

The capacitor 420 includes a bottom electrode 422 formed from the first metal layer, an insulator 424 formed from the second insulating layer, and an upper electrode 426 formed from the second metal layer. The PCM switch structure 400 and the capacitor 420 can be fabricated sharing the same process flow without the use of an extra mask and elements of the capacitor 420 can be fabricated at the same layer as elements of the PCM switch structure 400.

Figure 5:
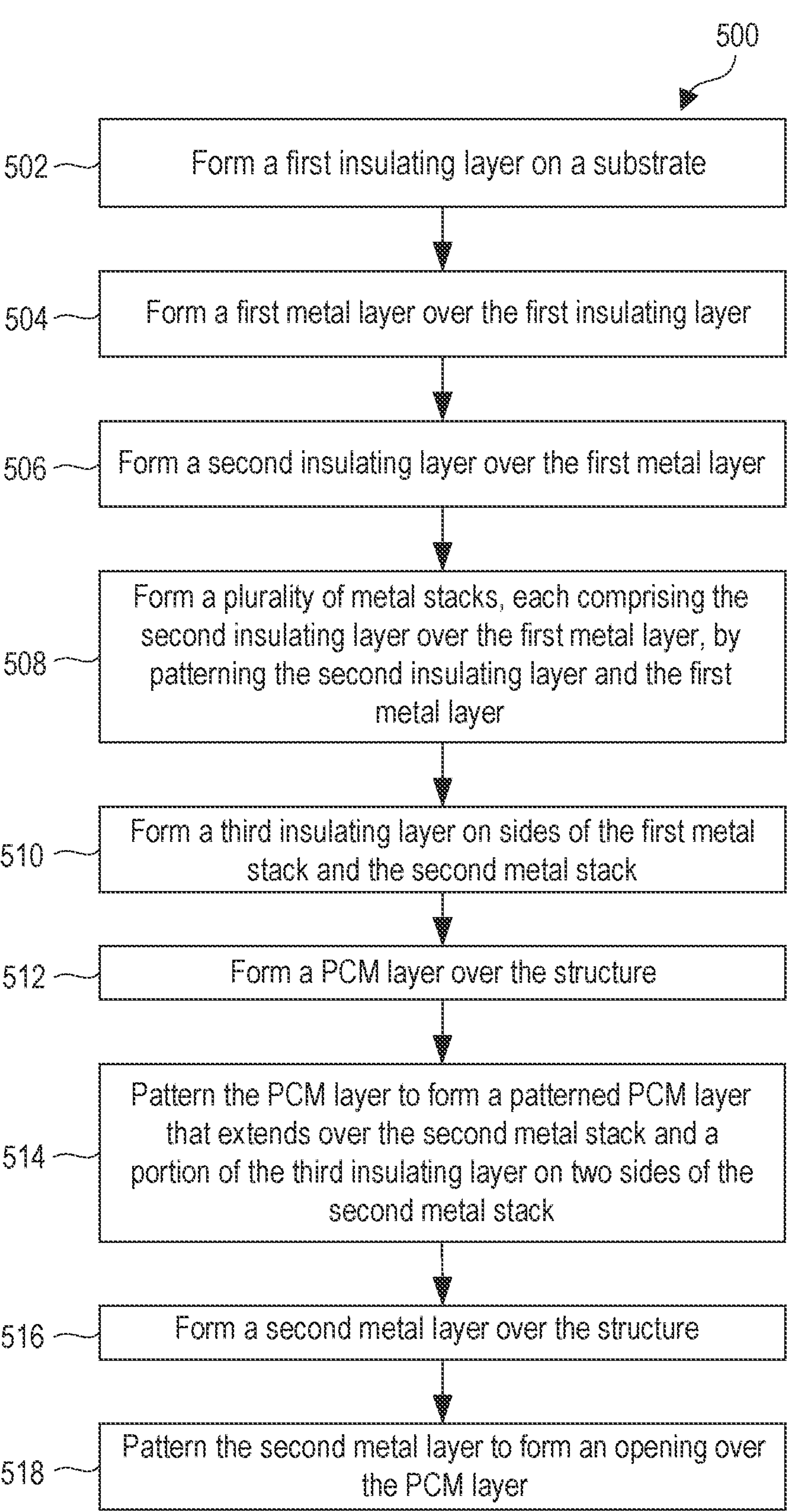
FIG. 5 is a process flow chart depicting an example method for forming a capacitor and switch in the same material layer, in accordance with some embodiments.

FIG. 5 is a process flow chart depicting an example method 500 for forming a capacitor and switch in the same material layer. FIG. 5 is described in conjunction with FIGS. 6A-6H, wherein FIGS. 6A-6H are cross-sectional views depicting intermediate stages in the formation of a capacitor and switch in parallel, in accordance with various embodiments of the disclosure.

As with the other method embodiments and exemplary devices discussed herein, it is understood that various parts may be fabricated by typical semiconductor technology process flow, and thus some processes are only briefly described herein. Further, it is noted that the process steps of method 500, including any descriptions given with reference to the figures, as with the remainder of the method and exemplary figures provided in this disclosure, are merely exemplary and are not intended to be limiting beyond what is specifically recited in the claims that follow.

At block 502, the example method 500 includes forming a first insulating layer on a substrate. Any suitable technique for forming the insulating layer can be employed, such as depositing the first insulating layer via Plasma Enhanced Chemical Vapor Deposition (PECVD) and/or growing the insulating layer by oxidizing the substrate at a high temperature.

Figures 6A, 6B, 6C, 6D, 6E, 6F, 6G, 6H:
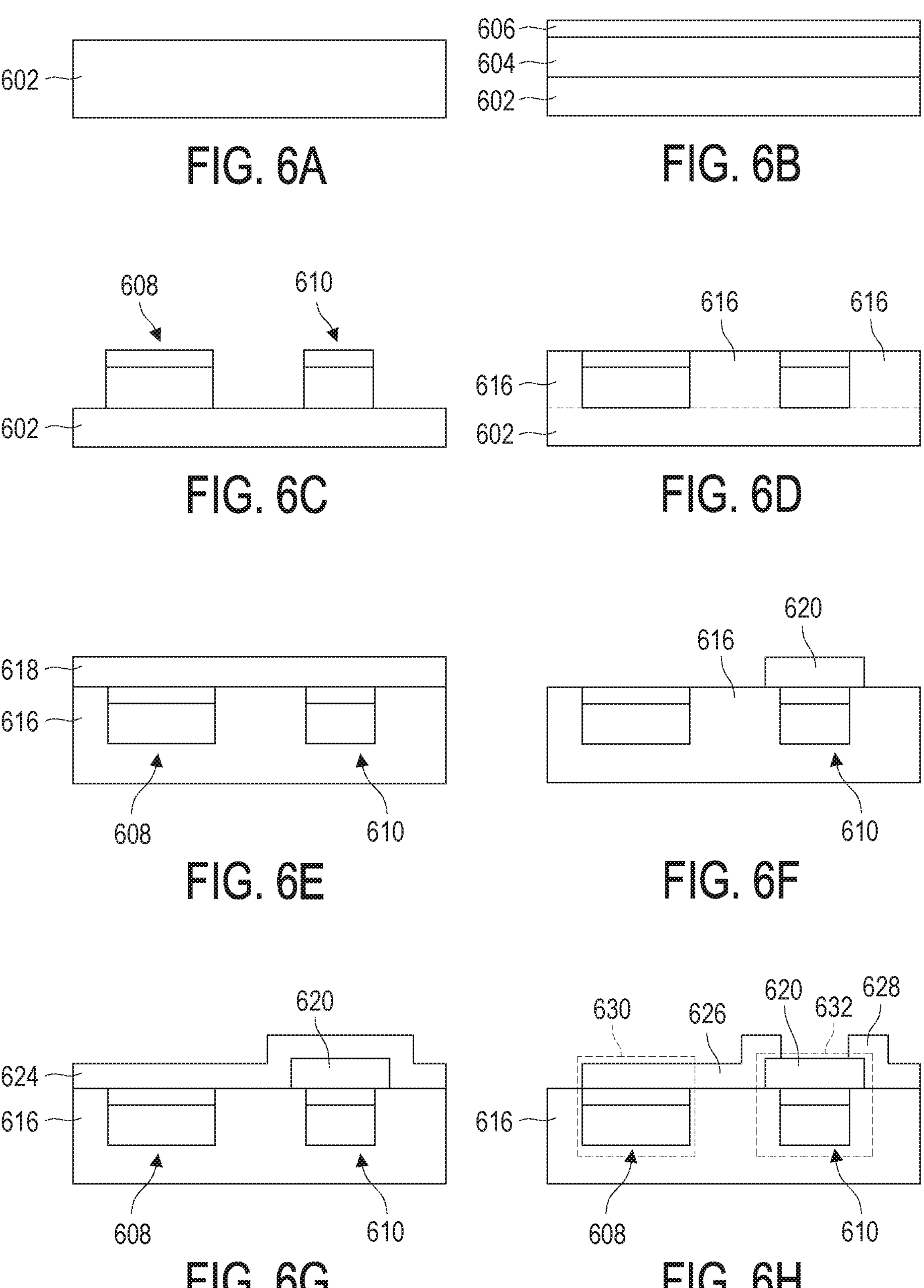
FIGS. 6A-6H are cross-sectional views depicting intermediate stages in the formation of a capacitor and switch in parallel, in accordance with some embodiments.

Referring to the example of FIG. 6A, in an embodiment of block 502, a first insulating layer 602 is provided on a substrate (not shown). The substrate can be formed of mechanically supportive, insulating, semiconducting and/or conducting materials, such as, but not limited to, Silicon Carbide (SiC), Silicon (Si), and/or Gallium Arsenide (GaAs), (Al2O3), Alumina, Quartz ($SiO_2$), Germanium (Ge), Gallium Nitride (GaN), Indium Phosphide (InP), Silicon-on-Insulator (SOI), Silicon-on-Sapphire (SOS), and/or Silicon Germanium (SiGe). The first insulating layer 602 has a thickness sufficient to electrically isolate a subsequently formed heating element from the substrate. The first insulating layer 602 can be formed of $SiO_2$, $Al_2O_3$, AlN, SiN, another oxide, or a variety of other electrically insulating materials.

The example method 500 includes, at block 504, forming a first metal layer over the first insulating layer. The first metal layer can include, for example, a metal or metal alloy material that exhibits low resistivity and a substantially high thermal conductivity. For example, the first metal layer can include one or more of Tungsten (W), Tungsten Nitride (WN), nickel silicon (NiSi), Aluminum (Al), or any of a variety of or a combination of similar metal or metal alloys that exhibits low resistivity, has substantially high thermal conductivity, and has a melting temperature that is higher than the melting temperature of the PCM used in the subsequently described PCM switch.

The example method 500 includes, at block 506, forming a second insulating layer over the first metal layer. The second insulating layer in various embodiments is a thermal boundary resistance (TBR) layer. A TBR layer may be formed by a suitable process such as Low Pressure Chemical Vapor Deposition (LPCVD), Plasma Enhanced Chemical Vapor Deposition (PECVD), High Density Chemical Plasma Vapor Deposition (HDPCVD), Atomic Layer Deposition (ALD), physical vapor deposition or high density plasma chemical vapor deposition (HDPCVD) techniques or spin on techniques. The TBR layer is an electrical insulator that is thermally conductive with properties that allow the TBR layer to electrically insulate the first metal layer and, at the same time, allow heat to pass through the TBR layer to overlying layers. The TBR layer can be formed from one or more of SiC, AlN, SiCO, SiCN, and SiN, or other materials having properties that allow the TBR layer to electrically insulate the first metal layer and, at the same time, allow heat to pass through the TBR layer to overlying layers.

Referring to the example of FIG. 6B, in an embodiment of blocks 504 and 506, a first metal layer 604 is formed over the first insulating layer 602, and a second insulating layer 606 over the first metal layer 604.

Next, at block 508, the example method 500 includes forming a plurality of metal stacks, each comprising the second insulating layer over the first metal layer, by patterning the second insulating layer and the first metal layer. In this example, two metal stacks are formed-one for use in forming a capacitor and one for use in forming a switch.

In various embodiments, patterning the second insulating layer and the first metal layer comprises forming a photoresist (PR) layer over the second insulating layer, patterning the PR layer to expose openings in the PR layer, transferring the pattern to the second insulating layer and the first metal layer to form the plurality of metal stacks, and removing the patterned PR layer. The PR layer is patterned to expose select portions of the underlying second insulating layer and the first metal layer to semiconductor processing, such as etching operations, while protecting covered portions of the underlying second insulating layer and the first metal layer from the semiconductor processing. The PR pattern may be formed by exposing and developing the PR layer in accordance with a desired pattern. The desired pattern protects a portion of the second insulating layer and the first metal layer from semiconductor processing while allowing other portions of the second insulating layer and the first metal layer to be removed, for example, by etching operations. The PR layer may be formed over the second insulating layer via spin-coating or spin casting deposition techniques, selectively irradiated, and developed to form the openings. The patterned PR layer may be removed by employing a chemical solvent and/or ashing operations.

Referring to the example of FIG. 6C, in an embodiment of block 508 a first metal stack 608 and a second metal stack 610 are formed over the first insulating layer 602.

Next, at block 510, the example method 500 includes forming a third insulating layer on sides of the first metal stack and the second metal stack. In various embodiments, forming a third insulating layer on sides of the first and metal stacks includes depositing a third insulating layer over the structure of FIG. 6C and planarizing the third insulating layer and the first and second metal stacks so that the third insulating layer is formed on sides of the first and second metal stacks, but not over the first and second metal stacks. In various embodiments, the planarizing is performed by chemical mechanical polishing (CMP) operations. In various embodiments, the third insulating layer is formed of $SiO_2$, $Al_2O_3$, AlN, SiN, another oxide, or a variety of other electrically insulating materials. In various embodiments, the third insulating layer is formed from the same material as the first insulating layer.

Referring to the example of FIG. 6D, in an embodiment of block 510, a third insulating layer 616 is formed on sides of the first metal stack 608 and the second metal stack 610.

At block 512, the example method 500 includes forming a PCM layer over the structure of FIG. 6D. In various embodiments, a PCM deposition process is performed on the structure of FIG. 6D to deposit PCM in the amorphous state to form a PCM layer. Alternatively, the PCM deposition process can be a heated deposition such that the PCM is deposited as a polycrystalline or crystalline film. The PCM layer can be formed from a variety of PCMs that exhibit variable electrical resistivity that is dependent on crystallinity. As an example, the PCM layer can be formed from a chalcogenide material, such as germanium telluride (GeTe), germanium antimony telluride (GeSbTe or GST), germanium selenium telluride (GeSeTe), antimony telluride (SbTe), In-doped PCM, and Sb-doped PCM or any of a variety of similar materials. The PCM can be deposited employing a variety of deposition techniques, such as Physical Vapor Deposition (PVD) (e.g., metal evaporation, sputtering), Chemical Vapor Deposition (CVD), and/or Atomic Layer Deposition (ALD).

Referring to the example of FIG. 6E, in an embodiment of block 512, a PCM layer 618 has been formed over the structure of FIG. 6D (e.g., the first metal stack 608, the second metal stack 610, and the third insulating layer 616).

At block 514, the example method 500 includes patterning the PCM layer to form a patterned PCM layer that extends over the second metal stack and a portion of the third insulating layer on two sides of the second metal stack. In various embodiments, the patterned PCM layer is formed by forming a PR layer over the structure of FIG. 6D; patterning the PR layer to cover the second metal stack and a portion of the third insulating layer on two sides of the second metal stack; removing the portions of the PCM layer not protected by the patterned PR layer, for example, via etching operations; and removing the patterned PR layer.

Referring to the example of FIG. 6F, in an embodiment of block 514, a patterned PCM layer 620 has been formed that extends over the second metal stack 610 and a portion of the third insulating layer 616 on two sides of the second metal stack 610.

At block 516, the example method 500 includes forming a second metal layer over the over the structure of FIG. 6F (e.g., the first metal stack 608, the third insulating layer 616, and the patterned PCM layer 620). The second metal layer may be formed from one or more of Tungsten (W), Tungsten Nitride (WN), nickel silicon (NiSi), or any of a variety of or a combination of similar metal or metal alloys that can be used as an electrode for a MIM capacitor.

Referring to the example of FIG. 6G, in an embodiment of block 516, a second metal layer 624 has been formed that extends over the first metal stack 608, the third insulating layer 616, and the patterned PCM layer 620.

At block 518, the example method 500 includes patterning the second metal layer to form an opening over the PCM layer. This results in a patterned pad layer over: the first metal stack, the third insulating layer between the first and second metal stacks, a portion of the patterned PCM layer not overlying the second metal stack, and a portion of the third insulating layer on the side of the second metal stack that is opposite to the side that faces the first metal stack. In various embodiments, the patterned pad layer is formed by forming a PR layer over the second metal layer; patterning the PR layer to cover the second metal stack and a portion of third insulating layer on two sides of the second metal stack; removing the portions of second metal layer not protected by the patterned PR layer, for example, via etching operations; and removing the patterned PR layer.

Referring to the example of FIG. 6H, in an embodiment of block 518, a patterned pad layer comprising a first RF pad 626 that is separated from a second RF pad 628 has been formed over: the first metal stack, the third insulating layer between the first and second metal stacks, a portion of the patterned PCM layer not overlying the second metal stack, and a portion of the third insulating layer on the side of the second metal stack that is opposite to the side that faces the first metal stack.

As a result, a capacitor 630 is formed by the first metal stack 608 and portion of the first RF pad 626 that extends over the first metal stack 630, and a switch 632 is formed by the first RF pad 626, the second RF pad 628, the patterned PCM layer 620, and the second metal stack 610.

Figure 7:
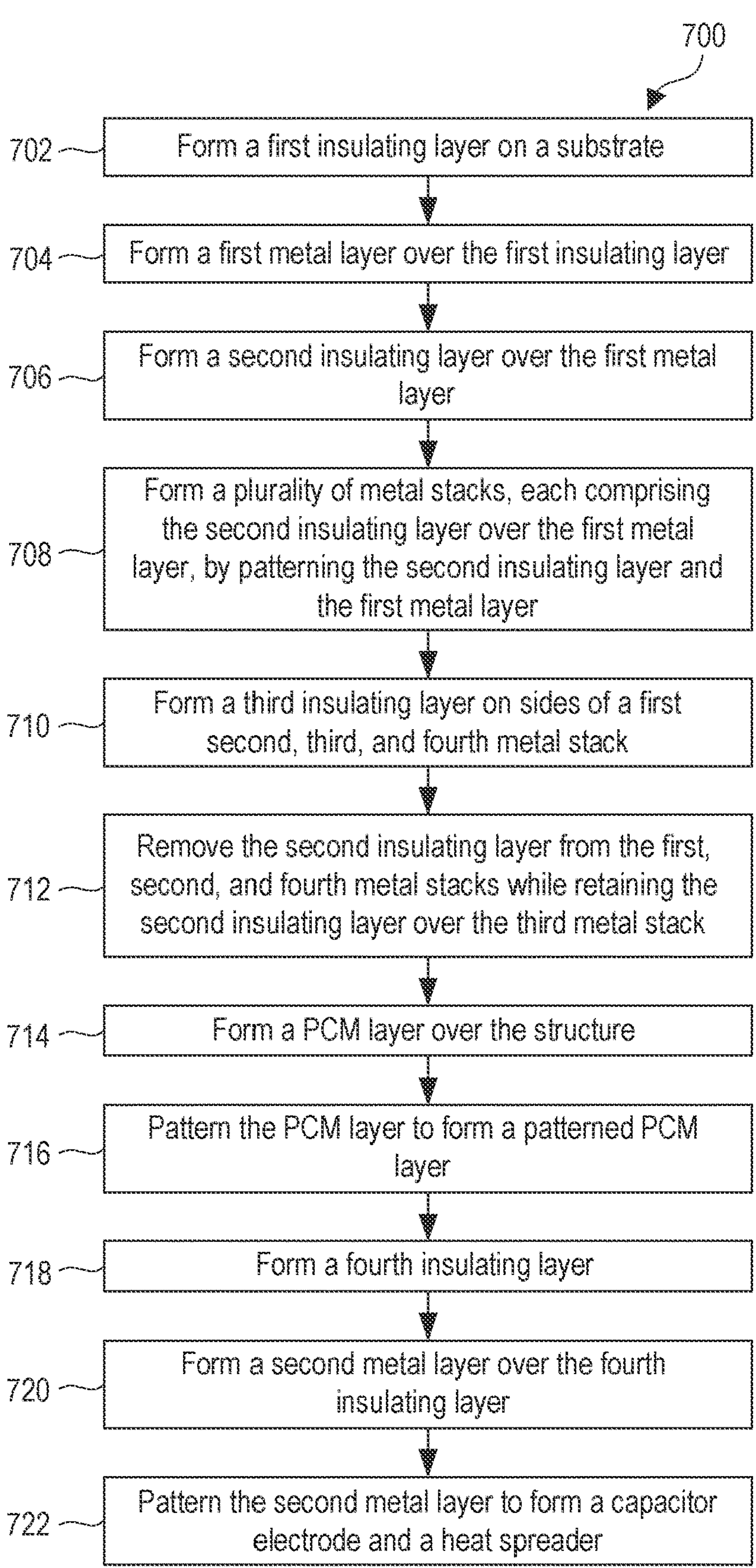
FIG. 7 is a process flow chart depicting another example method for forming a capacitor and switch in the same material layer, in accordance with some embodiments.

FIG. 7 is a process flow chart depicting another example method 700 for forming a capacitor and switch in the same material layer. FIG. 7 is described in conjunction with FIGS. 8A-8J, wherein FIGS. 8A-8J are cross-section diagrams depicting intermediate stages in the formation of a capacitor and switch in parallel, in accordance with various embodiments of the disclosure.

As with the other method embodiments and exemplary devices discussed herein, it is understood that various parts may be fabricated by typical semiconductor technology process flow, and thus some processes are only briefly described herein. Further, it is noted that the process steps of method 700, including any descriptions given with reference to the figures, as with the remainder of the method and exemplary figures provided in this disclosure, are merely exemplary and are not intended to be limiting beyond what is specifically recited in the claims that follow.

At block 702, the example method 700 includes forming a first insulating layer on a substrate. Any suitable technique for forming the insulating layer can be employed, such as depositing the first insulating layer via Plasma Enhanced Chemical Vapor Deposition (PECVD) and/or growing the insulating layer by oxidizing the substrate at a high temperature.

Figures 8A, 8B, 8C, 8D, 8E, 8F, 8G, 8H, 8I, 8J:
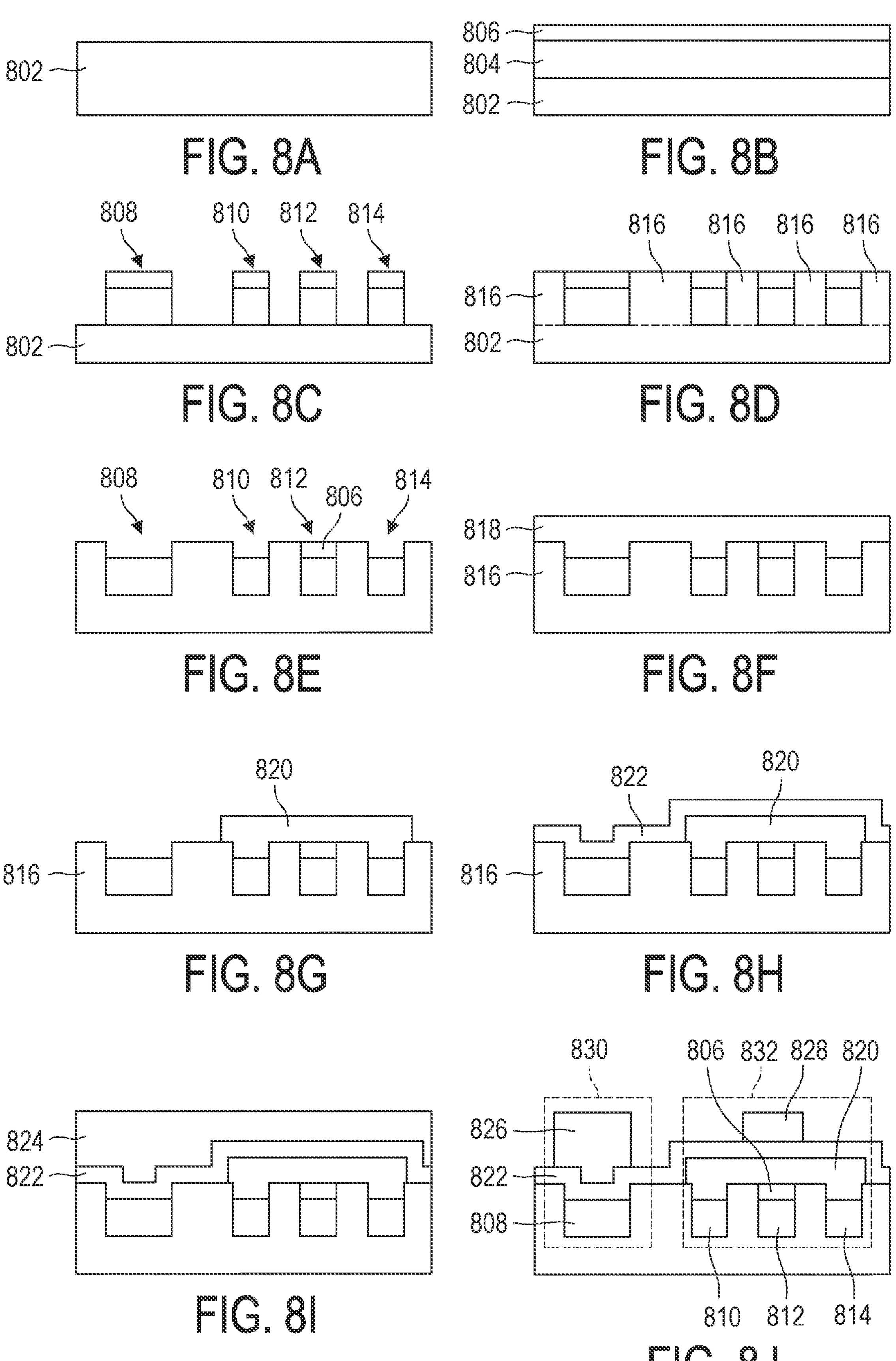
FIGS. 8A-8J are cross-sectional views depicting intermediate stages in the formation of a capacitor and switch in parallel, in accordance with some embodiments.

Referring to the example of FIG. 8A, in an embodiment of block 702, a first insulating layer 802 is provided on a substrate (not shown). The substrate can be formed of mechanically supportive, insulating, semiconducting and/or conducting materials, such as, but not limited to, Silicon Carbide (SiC), Silicon (Si), and/or Gallium Arsenide (GaAs), (Al2O3), Alumina, Quartz ($SiO_2$), Germanium (Ge), Gallium Nitride (GaN), Indium Phosphide (InP), Silicon-on-Insulator (SOI), Silicon-on-Sapphire (SOS), and/or Silicon Germanium (SiGe). The first insulating layer 702 has a thickness sufficient to electrically isolate a subsequently formed heating element from the substrate. The first insulating layer 702 can be formed of $SiO_2$, $Al_2O_3$, AlN, SiN, another oxide, or a variety of other electrically insulating materials.

The example method 700 includes, at block 704, forming a first metal layer over the first insulating layer. The first metal layer can include, for example, a metal or metal alloy material that exhibits low resistivity and a substantially high thermal conductivity. For example, the first metal layer can include one or more of Tungsten (W), Tungsten Nitride (WN), nickel silicon (NiSi), Aluminum (Al), or any of a variety of or a combination of similar metal or metal alloys that exhibits low resistivity, has substantially high thermal conductivity, and has a melting temperature that is higher than the melting temperature of the PCM used in the subsequently described PCM switch.

The example method 700 includes, at block 706, forming a second insulating layer over the first metal layer. The second insulating layer in various embodiments is a thermal boundary resistance (TBR) layer. A TBR layer may be formed by a suitable process such as Low Pressure Chemical Vapor Deposition (LPCVD), Plasma Enhanced Chemical Vapor Deposition (PECVD), High Density Chemical Plasma Vapor Deposition (HDPCVD), Atomic Layer Deposition (ALD), physical vapor deposition or high density plasma chemical vapor deposition (HDPCVD) techniques or spin on techniques. The TBR layer is an electrical insulator that is thermally conductive with properties that allow the TBR layer to electrically insulate the first metal layer and, at the same time, allow heat to pass through the TBR layer to overlying layers. The TBR layer can be formed from one or more of SiC, AlN, SiCO, SiCN, and SiN, or other materials having properties that allow the TBR layer to electrically insulate the first metal layer and, at the same time, allow heat to pass through the TBR layer to overlying layers.

Referring to the example of FIG. 8B, in an embodiment of blocks 704 and 706, a first metal layer 804 is formed over the first insulating layer 802, and a second insulating layer 806 over the first metal layer 804.

Next, at block 708, the example method 700 includes forming a plurality of metal stacks, each comprising the second insulating layer over the first metal layer, by patterning the second insulating layer and the first metal layer. In this example, four metal stacks are formed-one for use in forming a capacitor and three for use in forming a switch.

In various embodiments, patterning the second insulating layer and the first metal layer comprises forming a photoresist (PR) layer over the second insulating layer, patterning the PR layer to expose openings in the PR layer, transferring the pattern to the second insulating layer and the first metal layer to form the plurality of metal stacks, and removing the patterned PR layer. The PR layer is patterned to expose select portions of the underlying second insulating layer and the first metal layer to semiconductor processing, such as etching operations, while protecting covered portions of the underlying second insulating layer and the first metal layer from the semiconductor processing. The PR pattern may be formed by exposing and developing the PR layer in accordance with a desired pattern. The desired pattern protects a portion of the second insulating layer and the first metal layer from semiconductor processing while allowing other portions of the second insulating layer and the first metal layer to be removed, for example, by etching operations. The PR layer may be formed over the second insulating layer via spin-coating or spin casting deposition techniques, selectively irradiated, and developed to form the openings. The patterned PR layer may be removed by employing a chemical solvent and/or ashing operations.

Referring to the example of FIG. 8C, in an embodiment of block 708, a first metal stack 808, a second metal stack 810, a third metal stack 812, and a fourth metal stack 814 are formed over the first insulating layer 802.

Next, at block 710, the example method 700 includes forming a third insulating layer on sides of the first metal stack, the second metal stack, the third metal stack, and the fourth metal stack. In various embodiment, forming a third insulating layer on sides of the first, second, third, and fourth metal stacks includes depositing a third insulating layer over the structure of FIG. 8C and planarizing the third insulating layer and the first, second, third, and fourth metal stacks so that the third insulating layer is formed on sides of the first, second, third, and fourth metal stacks, but not over the first, second, third, and fourth metal stacks. In various embodiments, the planarizing is performed by chemical mechanical polishing (CMP) operations. In various embodiments, the third insulating layer is formed of $SiO_2$, $Al_2O_3$, AlN, SiN, another oxide, or a variety of other electrically insulating materials. In various embodiments, the third insulating layer is formed from the same material as the first insulating layer.

Referring to the example of FIG. 8D, in an embodiment of block 710, a third insulating layer 816 is formed on sides of the first metal stack 808, the second metal stack 810, the third metal stack 812, and the fourth metal stack 814.

At block 712, the example method 700 includes removing the second insulating layer (e.g., TBR) from the first, second, and fourth metal stacks while retaining the second insulating layer over the third metal stack. In various embodiments, the second insulating layer is removed by forming a PR layer over the structure of FIG. 8D, patterning the PR layer to include openings over the first, second, and fourth metal stacks, removing the portions of the second insulating layer not protected by the PR layer (the portions over the first, second, and fourth metal stacks), for example, via etching operations, and removing the patterned PR layer.

Referring to the example of FIG. 8E, in an embodiment of block 712, the second insulating layer 806 (e.g., TBR) has been removed from the first metal stack 808, the second metal stack 810, and the fourth metal stack 814, and has been retained over the third metal stack 812.

At block 714, the example method 700 includes forming a PCM layer over the structure of FIG. 8E. In various embodiments, a PCM deposition process is performed on the structure of FIG. 8E to deposit PCM in the amorphous state to form a PCM layer. Alternatively, the PCM deposition process can be a heated deposition such that the PCM is deposited as a polycrystalline or crystalline film. The PCM layer can be formed from a variety of PCMs that exhibit variable electrical resistivity that is dependent on crystallinity. As an example, the PCM layer can be formed from a chalcogenide material, such as germanium telluride (GeTe), germanium antimony telluride (GeSbTe or GST), germanium selenium telluride (GeSeTe), antimony telluride (SbTe), In-doped PCM, and Sb-doped PCM or any of a variety of similar materials. The PCM can be deposited employing a variety of deposition techniques, such as Physical Vapor Deposition (PVD) (e.g., metal evaporation, sputtering), Chemical Vapor Deposition (CVD), and/or Atomic Layer Deposition (ALD).

Referring to the example of FIG. 8F, in an embodiment of block 714, a PCM layer 818 has been formed over the structure of FIG. 8E (e.g., the TBR 806, the first metal stack 808, the second metal stack 810, the fourth metal stack 814, and the third insulating layer 816).

At block 716, the example method 700 includes patterning the PCM layer 818 to form a patterned PCM layer 820 that extends over the second metal stack 810, the TBR 806, the fourth metal stack 814, the third insulating layer 816 between the second metal stack 810 and the TBR 806, and the third insulating layer 816 between the TBR 806 and the fourth metal stack 814. In various embodiments, the patterned PCM layer 820 is formed by forming a PR layer over the structure of FIG. 8F; patterning the PR layer to cover the second metal stack 810, the TBR 806, the fourth metal stack 814, the third insulating layer 816 between the second metal stack 810 and the TBR 806, and the third insulating layer 816 between the TBR 806 and the fourth metal stack 814; removing the portions of the PCM layer 818 not protected by the PR layer, for example, via etching operations; and removing the patterned PR layer.

Referring to the example of FIG. 8G, in an embodiment of block 716, a patterned PCM layer 820 has been formed that extends over the second metal stack 810, the TBR 806, the fourth metal stack 814, the third insulating layer 816 between the second metal stack 810 and the TBR 806, and the third insulating layer 816 between the TBR 806 and the fourth metal stack 814.

At block 718, the example method 700 includes forming a fourth insulating layer over the over the third insulating layer 816, the first metal stack 808, and the patterned PCM layer 820 (e.g., the structure of FIG. 8G). In various embodiments, a deposition process is performed on the structure of FIG. 8G to deposit a fourth insulating layer. In various embodiments, the fourth insulating layer comprises a HK dielectric material that is suitable as an insulating layer in a MIM capacitor and to provide electrical isolation between a subsequently formed heat spreader and the PCM layer. The fourth insulating layer can be deposited employing a suitable deposition technique.

Referring to the example of FIG. 8H, in an embodiment of block 718, a fourth insulating layer 822 has been formed over the third insulating layer 816, the first metal stack 808, and the patterned PCM layer 820 (e.g., the structure of FIG. 8G).

At block 720, the example method 700 includes forming a second metal layer over the fourth insulating layer. The second metal layer may be formed from one or more of Tungsten (W), Tungsten Nitride (WN), nickel silicon (NiSi), or any of a variety of or a combination of similar metal or metal alloys that can be used as an electrode for a MIM capacitor.

Referring to the example of FIG. 8I, in an embodiment of block 720, a second metal layer 824 has been formed over the fourth insulating layer 822.

At block 722, the example method 700 includes patterning the second metal layer to form a capacitor electrode and a heat spreader for a PCM switch. The heat spreader provides for rapid cooling of the PCM layer and/or the heater to allow the PCM layer to change state between the conductive (i.e., "on") state and the blocking state (i.e., "off"). In various embodiments, the patterned second metal layer comprising the capacitor electrode and the heat spreader is formed by forming a PR layer over the structure of FIG. 8I; patterning the PR layer to cover a portion of the second metal layer over the first metal stack and a portion of the second metal layer over the third metal stack; removing the portions of the second metal layer not protected by the patterned PR layer, for example, via etching operations; and removing the patterned PR layer.

Referring to the example of FIG. 8J, in an embodiment of block 722, a capacitor electrode 826 is formed over the first metal stack 808 and a heat spreader 828 is formed over the third metal stack 812. As a result, a capacitor 830 is formed by the first metal stack 808 (which functions as a bottom capacitor electrode), the fourth insulating layer 822 (insulator in MIM capacitor), and the capacitor electrode 826 (which functions as a top capacitor electrode). A PCM switch 832 is also formed by the second metal stack 810 (which functions as a first RF pad), the fourth metal stack

814 (which functions as an input pad), the patterned PCM layer 820, the third metal stack 812 (which functions as a heater) and a TBR 806.

In various embodiments, the first metal stack 808 is coupled to the second metal stack 810 via intermetal lines (not shown), the fourth metal stack 814 provides an input pad for the switch, and the capacitor electrode 826 provides an output pad for the capacitor. In various embodiments, the third metal stack 812 is connected at one end to ground and at a second end to a heater voltage supply for generating a set pulse or a reset pulse for switching the PCM layer 820 between a crystalline low resistivity state and an amorphous high resistivity state.

In various embodiments, structures and fabrication methods are disclosed wherein a switch and a capacitor are fabricated sharing the same process flow without the use of an extra mask. A first capacitor electrode is formed in parallel in the same metal layer using the same mask as a component of the PCM switch (e.g., a PCM switch heater electrode). A second capacitor electrode is formed in parallel in the same metal layer using the same mask as another component of the PCM switch (e.g., a PCM switch input pad or a PCM switch heat spreader). The capacitor insulator is formed in parallel in the same layer using the same mask as a PCM switch insulator (e.g., TBR or insulator between heat spreader and PCM layer).

In various embodiments, a semiconductor fabrication method for forming elements of a capacitor and a switch in a same material layer is disclosed. The method includes: forming a first metal layer over a first insulating layer that overlays a substrate; forming a second insulating layer over the first metal layer using thermal boundary resistance (TBR) material that electrically insulates the first metal layer and conducts heat; forming a first metal stack and a second metal stack, each comprising material from the second insulating layer and the first metal layer, over the first insulating layer; forming a third insulating layer on sides of the first metal stack and the second metal stack; forming a patterned phase change material (PCM) layer that extends over the second metal stack and a portion of the third insulating layer on two sides of the second metal stack; and forming a patterned pad layer over: the first metal stack, the third insulating layer between the first and second metal stacks, a portion of the patterned PCM layer not overlying the second metal stack, and a portion of the third insulating layer on the side of the second metal stack that is opposite to the side that faces the first metal stack; wherein the capacitor is formed by the first metal stack and portion of the patterned pad layer that extends over the first metal stack; and wherein the switch is formed by the a second portion of the patterned pad layer, the patterned PCM layer, and the second metal stack.

In certain embodiments of the method, forming a first metal stack and a second metal stack includes: forming a first patterned photo resist (PR) layer over the TBR material; patterning the TBR material and the first metal layer through etching operations using the patterned PR layer as a mask to form the first and second metal stacks; and removing the first patterned PR layer.

In certain embodiments of the method, forming a third insulating layer on sides of the first and second metal stacks includes: depositing a third insulating layer over the substrate; and planarizing the third insulating layer and the first and second metal stacks via chemical mechanical polishing (CMP) operations.

In certain embodiments of the method, forming a patterned PCM layer includes: forming PCM over the substrate; forming a second patterned photo resist (PR) layer that covers the second metal stack and a portion of the third insulating layer on two sides of the second metal stack; removing portions of the PCM layer not protected by the second patterned PR layer through etching operations; and removing the second patterned PR layer.

In certain embodiments of the method, patterning the second metal layer includes forming a first RF pad that is separated from a second RF pad.

In certain embodiments of the method, the patterned pad layer is separated into a first RF pad that extends over the first metal stack and a second RF pad; the first RF pad forms a first electrode of the capacitor; the second RF pad provides an input to the switch; and the first metal layer of the first metal stack provides an output electrode for the capacitor.

In various embodiments, a semiconductor fabrication method for forming a capacitor and switch in parallel is disclosed. The method includes: forming a first metal layer over a first insulating layer that overlays a substrate; forming a thermal boundary resistance (TBR) layer over the first metal layer using insulator material that conducts heat; forming first, second, third, and fourth metal stacks by patterning and etching the TBR layer and the first metal layer; forming a second insulating layer on sides of the first, second, third, and fourth metal stacks; removing the TBR layer from the first, second, and fourth metal stacks; forming a patterned phase change material (PCM) layer that extends over: the second, third, and fourth metal stacks, second insulating layer material between the second and third metal stacks, and second insulating layer material between the third and fourth metal stacks; forming a dielectric layer over the substrate; forming a second metal layer over the dielectric layer; and patterning the second metal layer to form a capacitor electrode that extends over the first metal stack; wherein the capacitor is formed by the first metal stack, the dielectric layer over the first metal stack, and the capacitor electrode; and wherein the switch is formed by the second, third, and fourth metal stacks, the TBR layer, and the patterned PCM layer.

In certain embodiments of the method, forming first, second, third, and fourth metal stacks comprises: forming a first patterned photo resist (PR) layer over the TBR material layer; patterning the TBR material layer and the metal layer using the PR layer as a mask through etching operations to form the first, second, third, and fourth metal stacks; and removing the first patterned PR layer.

In certain embodiments of the method, forming the second insulating layer on sides of the first, second, third, and fourth metal stacks includes: depositing the second insulating layer over the substrate; and planarizing the second insulating layer and TBR material over the first, second, third, and fourth metal stacks using chemical mechanical polishing (CMP) operations.

In certain embodiments of the method, forming a patterned PCM layer includes: forming PCM over the substrate; forming a second patterned PR layer over the PCM having a pattern that extends over: the second, third, and fourth metal stacks, insulating material between the second and third metal stacks, and insulating material between the third and fourth metal stacks; removing PCM not covered by the second patterned PR layer; and removing the second patterned PR layer.

In certain embodiments of the method, patterning the second metal layer includes patterning the second metal layer to form a heat spreader that extends over the third metal stack, wherein the heat spreader layer is positioned to quench heat generated to bias the patterned PCM layer.

In certain embodiments of the method, the first metal stack is coupled to the second metal stack via intermetal lines; the fourth metal stack provides an input pad for the switch; and the capacitor electrode provides an output pad for the capacitor.

In various embodiments, a device that includes a capacitor and a phase change material (PCM) switch having elements formed in the same material layer is disclosed. The device includes: a first insulating layer overlying a substrate; a first metal layer over the first insulating layer wherein the first metal layer includes a first capacitor electrode separated by a second insulating layer from a first component of the switch; a dielectric layer over the first metal layer, wherein the dielectric layer includes a capacitor insulator separated by the second insulating layer from a PCM switch insulator; and a second metal layer over the dielectric layer, wherein the second metal layer includes a second capacitor electrode separated from a second component of the switch.

In certain embodiments of the device, the first component of the switch includes a heater electrode, the second component of the switch includes a switch input pad, and the PCM switch insulator includes a thermal boundary resistance (TBR) layer used as a heater insulator.

In certain embodiments, the device further includes a PCM layer that extends over the heater insulator and a portion of the second insulating layer on two sides of the heater insulator and wherein the second metal layer overlies: the second insulating layer between the capacitor insulator and the heater insulator, a portion of the patterned PCM layer that extends beyond the heater insulator, and a portion of the second insulating layer on a side of the heater insulator that is opposite to a side of the heater insulator that faces the capacitor insulator.

In certain embodiments of the device, the capacitor is formed by the first capacitor electrode, the capacitor insulator, and the second capacitor electrode; the PCM switch is formed by the heater electrode, the heater insulator, the PCM layer, and the second metal layer; the second component is separated into a first RF pad that extends to the second capacitor electrode and a second RF pad; the first RF pad is coupled to the second capacitor electrode; the second RF pad provides an input to the switch; and the first capacitor electrode provides an output for the capacitor.

In certain embodiments of the device, the first component of the switch includes a first pad electrode which is separated by the second insulating layer from the heater electrode which is separated by the second insulating layer from a second pad electrode; the second component of the switch includes a heat spreader; and the PCM switch insulator provides electrical isolation between a heat spreader and a PCM layer.

In certain embodiments, the device further includes: a TBR layer over the heater electrode; and a patterned phase change material (PCM) layer that extends over: the first pad electrode, the heater electrode, the second pad electrode, a portion of the second insulating layer between the first pad electrode and the heater electrode, and a portion of the second insulating layer between the heater electrode and the second pad electrode.

In certain embodiments of the device, the capacitor is formed by the first capacitor electrode, the dielectric layer, and the second capacitor electrode; and the PCM switch is formed by the first pad electrode, the heater electrode, the second pad electrode, the TBR layer, and the patterned PCM layer.

In certain embodiments of the device, the first capacitor electrode is coupled to the first pad electrode via intermetal lines; the second pad electrode provides an input pad for the switch; and the second capacitor electrode provides an output pad for the capacitor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor fabrication method for forming elements of a capacitor and a switch in a same material layer, the method comprising:

forming a first metal layer over a first insulating layer that overlays a substrate;

forming a second insulating layer over the first metal layer using thermal boundary resistance (TBR) material that electrically insulates the first metal layer and conducts heat;

patterning a first metal stack and a second metal stack, each comprising material from the second insulating layer and the first metal layer, over the first insulating layer;

forming a third insulating layer on sides of the first metal stack and the second metal stack;

forming a patterned phase change material (PCM) layer that extends over the second metal stack and a portion of the third insulating layer on two sides of the second metal stack; and forming a patterned pad layer over: the first metal stack, the third insulating layer between the first and second metal stacks, a portion of the patterned PCM layer not overlying the second metal stack, and a portion of the third insulating layer on the side of the second metal stack that is opposite to the side that faces the first metal stack;

wherein the capacitor is formed by the first metal stack and a first portion of the patterned pad layer that extends over the first metal stack; and wherein the switch is formed by a second portion of the patterned pad layer, the patterned PCM layer, and the second metal stack.

2. The method of claim 1, wherein forming a first metal stack and a second metal stack comprises:

forming a first patterned photo resist (PR) layer over the TBR material;

patterning the TBR material and the first metal layer through etching operations using the patterned PR layer as a mask to form the first and second metal stacks; and removing the first patterned PR layer.

3. The method of claim 1, wherein forming a third insulating layer on sides of the first and second metal stacks comprises:

depositing a third insulating layer over the substrate; and planarizing the third insulating layer and the first and second metal stacks via chemical mechanical polishing (CMP) operations.

4. The method of claim 1, wherein forming a patterned PCM layer comprises:

forming a PCM layer over the substrate;

forming a second patterned photo resist (PR) layer that covers the second metal stack and a portion of the third insulating layer on two sides of the second metal stack;

removing portions of the PCM layer not protected by the second patterned PR layer through etching operations; and removing the second patterned PR layer.

5. The method of claim 1, wherein patterning the second metal layer comprises forming a first pad that is separated from a second pad.

6. The method of claim 1, wherein:

the patterned pad layer is separated into a first pad that extends over the first metal stack and a second pad;

the first pad forms a first electrode of the capacitor;

the second pad provides an input to the switch; and the first metal layer of the first metal stack provides an output electrode for the capacitor.

7. A semiconductor fabrication method for forming a capacitor and switch in parallel, the method comprising:

forming a first metal layer over a first insulating layer that overlays a substrate;

forming a thermal boundary resistance (TBR) layer over the first metal layer using insulator material that conducts heat;

forming first, second, third, and fourth metal stacks by patterning and etching the TBR layer and the first metal layer;

forming a second insulating layer on sides of the first, second, third, and fourth metal stacks;

removing the TBR layer from the first, second, and fourth metal stacks;

forming a patterned phase change material (PCM) layer that extends over: the second, third, and fourth metal stacks, second insulating layer material between the second and third metal stacks, and second insulating layer material between the third and fourth metal stacks;

forming a dielectric layer over the substrate;

forming a second metal layer over the dielectric layer; and patterning the second metal layer to form a capacitor electrode that extends over the first metal stack;

wherein the capacitor is formed by the first metal stack, the dielectric layer over the first metal stack, and the capacitor electrode; and wherein the switch is formed by the second, third, and fourth metal stacks, the TBR layer, and the patterned PCM layer.

8. The method of claim 7, wherein forming first, second, third, and fourth metal stacks comprises:

forming a first patterned photo resist (PR) layer over the TBR layer;

patterning the TBR layer and the first metal layer using the PR layer as a mask through etching operations to form the first, second, third, and fourth metal stacks; and removing the first patterned PR layer.

9. The method of claim 7, wherein forming the second insulating layer on sides of the first, second, third, and fourth metal stacks comprises:

depositing the second insulating layer over the substrate; and planarizing the second insulating layer and TBR layer over the first, second, third, and fourth metal stacks using chemical mechanical polishing (CMP) operations.

10. The method of claim 7, wherein forming a patterned PCM layer comprises:

forming PCM over the substrate;

forming a second patterned PR layer over the PCM having a pattern that extends over: the second, third, and fourth metal stacks, insulating material between the second and third metal stacks, and insulating material between the third and fourth metal stacks;

removing the PCM not covered by the second patterned PR layer; and removing the second patterned PR layer.

11. The method of claim 7, wherein patterning the second metal layer comprises patterning the second metal layer to form a heat spreader that extends over the third metal stack, wherein the heat spreader layer is positioned to quench heat generated to bias the patterned PCM layer.

12. The method of claim 7, wherein:

the first metal stack is coupled to the second metal stack via intermetal lines;

the fourth metal stack provides an input pad for the switch; and the capacitor electrode provides an output pad for the capacitor.

13. A method comprising:

depositing first metal material over a first insulating layer that overlays a substrate;

depositing thermal boundary resistance (TBR) material over the first metal material;

patterning the first metal material and the TBR material to provide a first stack for a capacitor and to provide a second stack for a phase change material (PCM) switch;

depositing an insulating layer between the first stack and the second stack;

forming a PCM layer over the second stack;

depositing second metal material over the first stack, the insulating layer, and the PCM layer; and patterning the second metal material to provide a first pad and a second pad.

14. The method of claim 13 wherein patterning the first metal material and the TBR material comprises:

forming a first patterned photo resist (PR) layer over the TBR material;

patterning the TBR material and the first metal material through etching operations using the first patterned PR layer as a mask to form the first stack and the second stack; and removing the first patterned PR layer.

15. The method of claim 13, wherein depositing the insulating layer between the first stack and the second stack comprises:

depositing the insulating layer over the substrate; and planarizing the insulating layer and the first stack and the second stack via chemical mechanical polishing (CMP) operations.

16. The method of claim 13, wherein forming the PCM layer comprises:

depositing a PCM material over the substrate;

forming a second patterned photo resist (PR) layer that covers the second stack and a portion of the insulating layer on two sides of the second stack;

removing portions of the PCM material not protected by the second patterned PR layer through etching operations; and removing the second patterned PR layer.

17. The method of claim 13, wherein patterning the second metal material comprises separating the second metal material into the first pad and the second pad, wherein the first pad extends over the first stack and a portion of the second stack, and the second pad extends over a different portion of the second stack and provides as an input to the PCM switch.

18. The method of claim 17, wherein the first pad is configured as both a top electrode for the capacitor and a first terminal for the PCM switch, and the second pad is configured as a second terminal for the PCM switch.

19. The method of claim 13, wherein the first stack comprises a bottom electrode and a dielectric for the capacitor.

20. The method of claim 13, wherein the first metal material of the second stack is configured to function as a heating element and a TBR layer for the PCM switch.

* * * * *